United States Patent
Kang

(10) Patent No.: US 9,013,917 B2
(45) Date of Patent: Apr. 21, 2015

(54) SEMICONDUCTOR MEMORY DEVICE

(75) Inventor: Hee Bok Kang, Cheongju-si (KR)

(73) Assignee: SK Hynix Inc., Icheon (KR), 1

(*) Notice: Subject to any disclaimer, the term of this patent is extended or adjusted under 35 U.S.C. 154(b) by 489 days.

(21) Appl. No.: 13/593,893

(22) Filed: Aug. 24, 2012

(65) Prior Publication Data

US 2013/0294154 A1    Nov. 7, 2013

(30) Foreign Application Priority Data

May 4, 2012 (KR) .................. 10-2012-0047418

(51) Int. Cl.
 *G11C 11/00* (2006.01)
 *G11C 13/00* (2006.01)

(52) U.S. Cl.
 CPC ........ *G11C 13/0004* (2013.01); *G11C 2213/71* (2013.01); *G11C 2213/74* (2013.01); *G11C 2213/75* (2013.01); *G11C 2213/79* (2013.01); *Y10S 977/754* (2013.01)

(58) Field of Classification Search
 USPC ............. 365/46, 94, 100, 113, 129, 148, 163; 257/2–5, 296, E31.047, E27.006; 438/29, 95, 96, 166, 259, 365, 482, 438/486, 597; 977/754
 See application file for complete search history.

(56) References Cited

U.S. PATENT DOCUMENTS

| | | | | |
|---|---|---|---|---|
| 5,341,328 | A * | 8/1994 | Ovshinsky et al. | 365/163 |
| 5,406,509 | A * | 4/1995 | Ovshinsky et al. | 365/113 |
| 5,596,522 | A * | 1/1997 | Ovshinsky et al. | 365/113 |
| 5,687,112 | A * | 11/1997 | Ovshinsky | 365/163 |
| 7,532,507 | B2 * | 5/2009 | Hayakawa | 365/163 |
| 7,683,404 | B2 | 3/2010 | Jang et al. | |
| 7,817,464 | B2 * | 10/2010 | Kuh et al. | 365/163 |
| 2010/0321989 | A1 * | 12/2010 | Lee | 365/163 |

FOREIGN PATENT DOCUMENTS

KR    10-0900121 B1    6/2009

* cited by examiner

*Primary Examiner* — Harry W Byrne

(57) ABSTRACT

A semiconductor memory device is disclosed, which relates to a technology for a serial cell structure of a phase change memory (PCM). The semiconductor memory device includes a plurality of unit cells stacked with a plurality of layers, and a single bit line formed to have a vertical structure and shared by the plurality of unit cells. Each unit cell includes a switching element including a source region, a drain region, and a channel region, and a phase change resistor (PCR) element formed over the switching element.

20 Claims, 15 Drawing Sheets

SEMICONDUCTOR MEMORY DEVICE

CROSS-REFERENCE TO RELATED APPLICATION

The priority of Korean patent application No. 10-2012-0047418 filed on May 4, 2012, the disclosure of which is hereby incorporated in its entirety by reference, is claimed.

BACKGROUND OF THE INVENTION

Embodiments of the present invention relate to a semiconductor memory device, and more specifically to a cell structure of a phase change memory (PCM) device, which includes a plurality of vertically laminated unit cells.

Generally, a non-volatile memory device (e.g., a magnetic memory device, a phase change memory (PCM) device, or the like) has a data processing speed similar to that of a volatile random access memory (RAM) device. The non-volatile memory device also preserves data even when power is turned off.

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provided to the PCM layer 2, and a high temperature is induced in the PCM layer 2. As a result, the electrical conductivity of the PCM layer 2 changes depending on resistance variation. The PCM layer 2 may be formed of AgInSbTe. The PCM layer 2 uses chalcogenide, the main components of which are chalcogen elements such as S, Se and Te. The PCM layer 2 may be formed of germanium antimony tellurium (Ge2Sb2Te5) composed of Ge—Sb—Te.

FIGS. 2A and 2B illustrate a phase change principle of the conventional PCR element 4.

Referring to FIG. 2A, if a low current smaller than a threshold value flows in the PCR element 4, the PCM layer 2 has a temperature suitable for a crystalline phase. Therefore, the PCM layer 2 changes to the crystalline phase, such that it is changed to a low-resistance phase material.

On the other hand, as shown in FIG. 2B, if a high current greater than the threshold value flows in the PCR element 4, the PCM layer 2 has a temperature higher than a melting point. Therefore, the PCM layer 2 changes to an amorphous phase, such that it is changed to a high-resistance phase material.

As described above, the PCR element 4 can store data corresponding to two resistance phases. For example, if the PCR element 4 has a low-resistance phase set to data '1' and the PCR element 4 has a high-resistance phase set to data '0', the PCR element 4 may store two logic states of data.

In addition, since a phase of the PCM layer (i.e., a phase change resistive material) 2 is not changed even when a phase change memory device is powered off, the aforementioned data can be stored as non-volatile data.

FIG. 3 illustrates a write operation of a conventional PCR element.

Referring to FIG. 3, when a current flows between the top electrode 1 and the bottom electrode 3 of the PCR element 4 for a predetermined time, heat is generated. Therefore, the PCM layer 2 is changed from a crystalline phase to an amorphous phase in response to heat applied to the top electrode 1 and the bottom electrode 3.

In this case, assuming that a low current smaller than a threshold value flows in the PCR element 4 for a predetermined time, the PCM layer 2 with a crystalline phase is formed by a low-temperature heating state, such that the PCR element 4 becomes a low-resistance element having a set state. Otherwise, assuming that a high current greater than the threshold value flows in the PCR element 4 for a predetermined time, the PCM layer 2 with an amorphous phase is formed by high-temperature heating, such that the PCR element 4 becomes a high-resistance element having a reset status. Thus, a difference between two phases is represented by a variation in electrical resistance.

Accordingly, in order to write the set state during a write operation mode, a low voltage is applied to the PCR element 4 for a long period of time. On the other hand, in order to write the reset state during the write operation mode, a high voltage is applied to the PCR element 4 for a short period of time.

However, a problem of phase change memory (PCM) devices using the PCR element is an excessively high write current for writing data in a cell. Therefore, the number of cells where data is simultaneously written is limited, such that write performance is deteriorated.

BRIEF SUMMARY OF THE INVENTION

Various embodiments of the present invention are directed to providing a semiconductor memory device that substantially obviates one or more problems due to limitations and disadvantages of the related art.

An embodiment of the present invention relates to a semiconductor memory device including a plurality of phase change resistor (PCR) elements that are vertically laminated and coupled in series, resulting in lower manufacturing costs of the cells.

Another embodiment of the present invention relates to a semiconductor memory device for commonly using one bit line having a vertical structure in a plurality of unit cells sequentially stacked, resulting in minimum manufacturing costs of the cells.

Still another embodiment of the present invention relates to a technology of simply implementing a memory device capable of simultaneously storing a plurality of data using serially-coupled resistors.

In accordance with one embodiment of the present invention, a semiconductor memory device includes a first plurality of unit cells sequentially stacked in a plurality of layers; and a bit line having a vertical structure and coupled to each of the first plurality of unit cells. Each of the first plurality of unit cells includes a switching element including a source region, a drain region, and a channel region; and a phase change resistor (PCR) element formed over the switching element.

In accordance with another embodiment of the present invention, a semiconductor memory device includes a first plurality of unit cells sequentially stacked in a plurality of layers; and a single bit line having a vertical structure and shared by the first plurality of unit cells. Each of the first plurality of unit cells includes a switching element including an emitter region, a collector region, and a base region; and a phase change resistor (PCR) element formed over the switching element.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor memory device according to the present invention will hereinafter be described with reference to the annexed drawings.

Figure 1A:
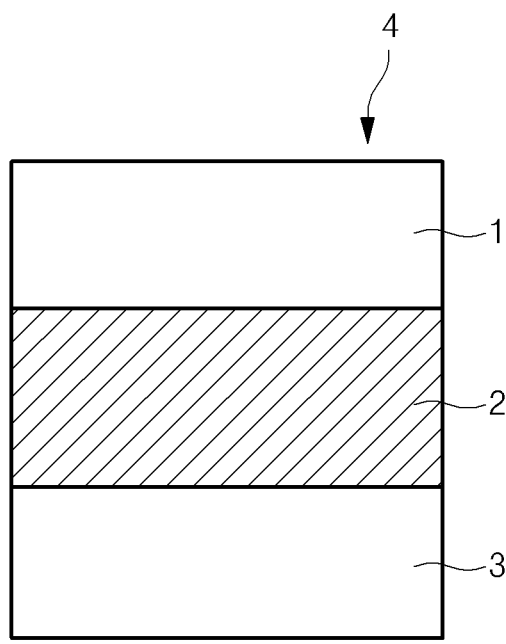
FIGS. 1A and 1B illustrate a conventional phase change resistor (PCR) element.
Figure 1B:
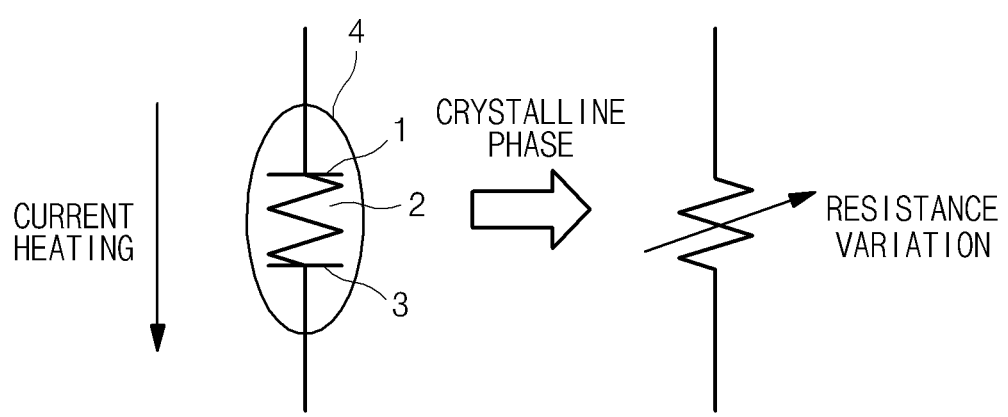
Figure 2A:
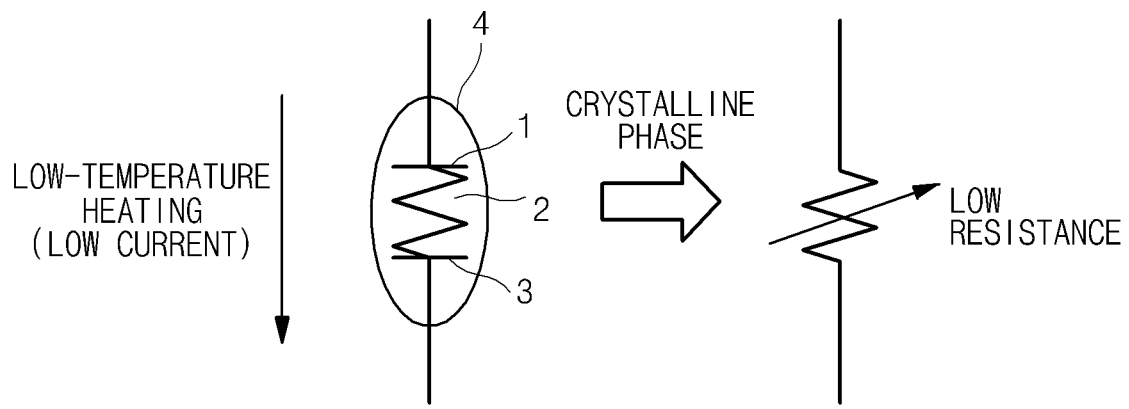
FIGS. 2A and 2B illustrate a phase change principle of a conventional PCR element.
Figure 2B:
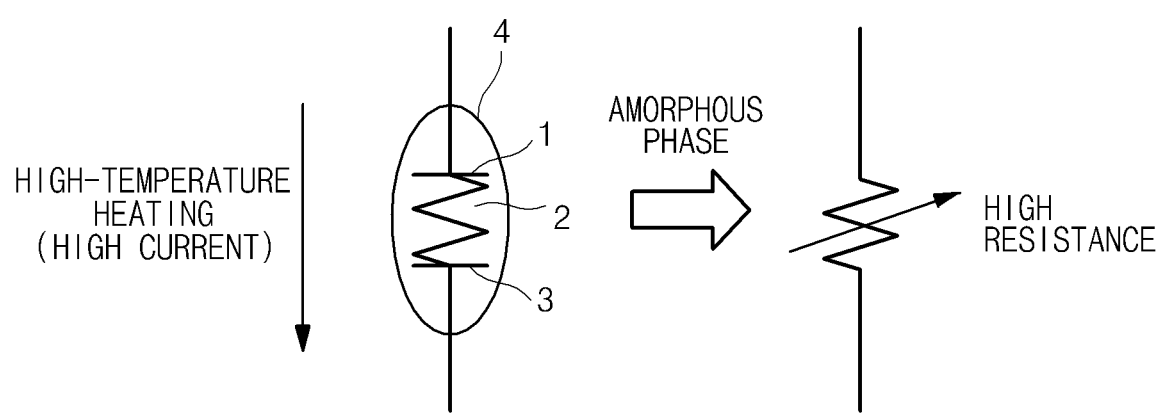
Figure 3:
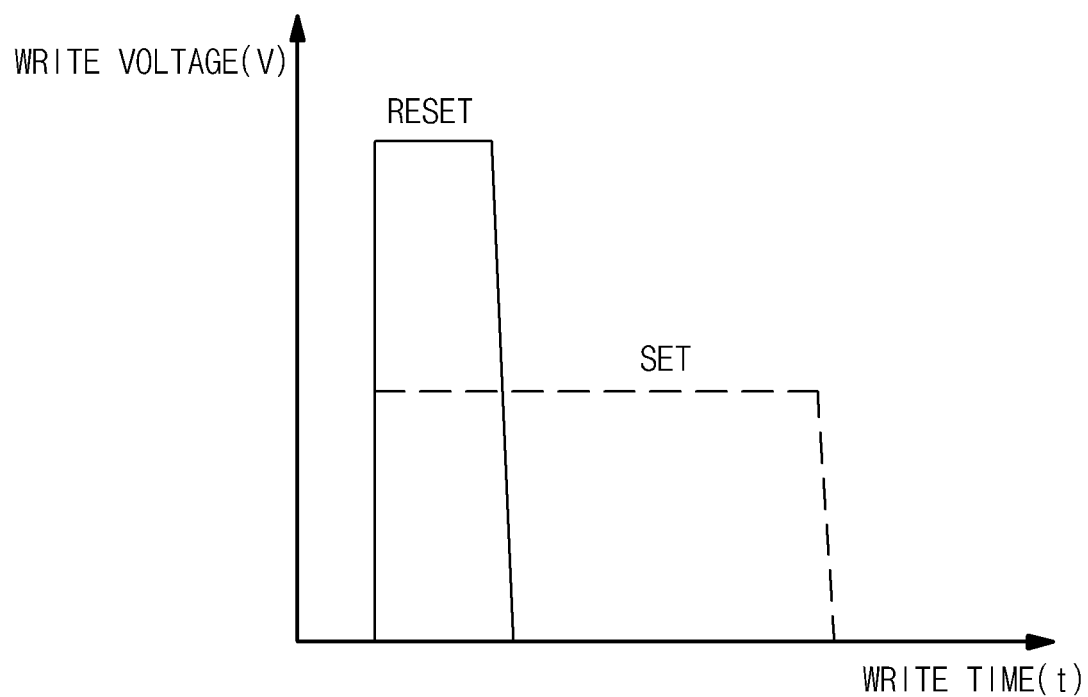
FIG. 3 illustrates a write operation of a conventional PCR element.
Figure 4:
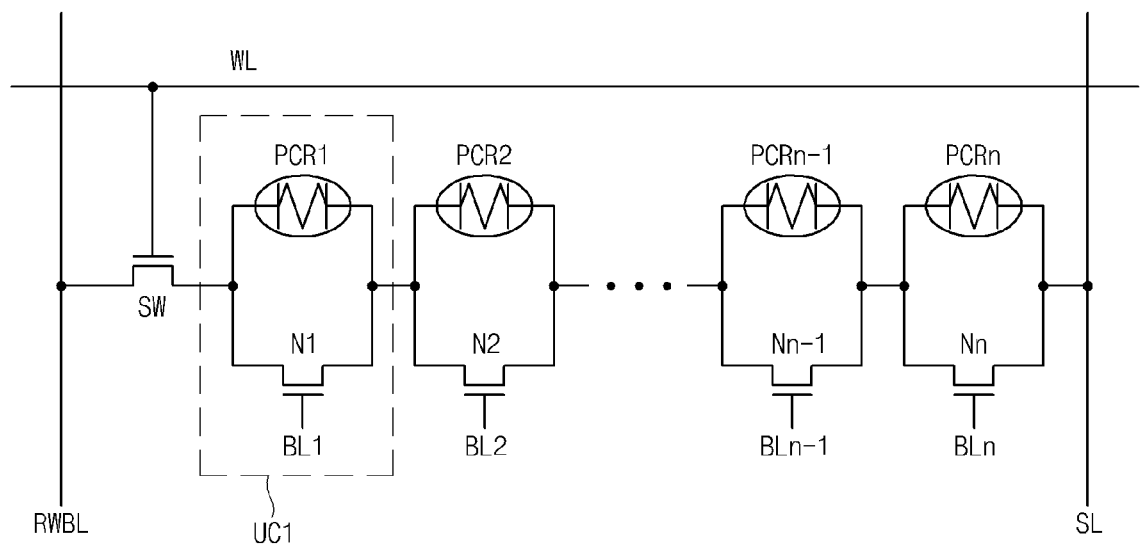
FIG. 4 illustrates a circuit diagram of a semiconductor memory device according to an embodiment of the present invention.

FIG. 4 illustrates a circuit diagram of a semiconductor memory device according to an embodiment of the present invention.

Referring to FIG. 4, the semiconductor memory device includes a selection switch SW, a plurality of phase change resistor (PCR) elements PCR1~PCRn, and a plurality of switching elements N1~Nn. One PCR element and one switching element coupled with the PCR element construct a unit cell.

The selection switch SW may comprise an NMOS transistor. The selection switch SW is coupled to and disposed between a read/write bit line RWBL and a unit cell UC1, and has a gate terminal coupled to a word line WL. The unit cell UC1 is composed of the PCR element PCR1 and the switching element N1.

In the unit cell UC1, the PCR element PCR1 and the switching element N1 are coupled in parallel to each other. One electrode of the PCR element PCR1 is coupled to a source terminal of the switching element N1, and the other electrode thereof is coupled to a drain terminal of the switching element N1. In addition, gate terminals of the switching elements N1~Nn are coupled to a plurality of bit lines BL1~BLn, respectively.

In addition, the plurality of PCR elements PCR1~PCRn are coupled in series between the selection switch SW and a source line SL. For example, a second electrode of PCR element PCR1 is coupled to a first electrode of neighboring PCR element PCR2. A first PCR element PCR1 from among the plurality of serially-coupled PCR elements PCR1~PCRn is coupled to the selection switch SW, and the last PCR element PCRn is coupled to the source line SL.

In this case, the word line WL indicates an output signal of a row decoder, which commonly selects a plurality of bits. In accordance with an embodiment of the present invention, when one word line WL is activated, a plurality of bits can be simultaneously stored in the plurality of PCR elements PCR1~PCRn according to on/off operations of the selection switch SW. Individual bit lines BL1~BLn may correspond to data lines for transferring one bit of data to the individual PCR elements PCR1~PCRn, respectively.

When a bit line coupled to a unit cell is activated, a switching element of the unit cell is switched on so that current can flow through two lines passing through a PCR element and the switching element, respectively, of the unit cell in parallel, thereby reducing the amount of current in each line. For example, in unit cell UC1, when selection switch SW is activated, current flows through unit cell UC1. If the bit line BL1 is not activated, switching element N1 is switched off so that current does not flow through the lower line, and all of the current passing through the cell flows through the PCR element PCR1. On the other hand, if the bit line BL1 is activated, switching element N1 is activated so that current flows in parallel through both the upper line passing through the PCR element PCR1, and the lower line running across switching element N1.

Therefore, the switching element coupled to the bit line for each unit cell effectively controls the amount of current experienced by a corresponding PCR element. When the switching element is not activated, a high level of current flows across the PCR element, and if the switching element is activated, a parallel path is formed across the unit cell, and a lower amount of current flows across the PCR element. In write mode, high current conditions correspond to a reset condition, while low current conditions correspond to a set condition.

In accordance with an embodiment of the present invention, data can be simultaneously written in the plurality of PCR elements PCR1~PCRn without increasing a write current according to the plurality of unit cells.

Therefore, embodiments of the present invention can reduce the magnitude of a write current used for writing data in n numbers of PCR elements to 1/n compared to the related art, n corresponding to the number of the PCR elements PCR1~PCRn. In addition, embodiments of the present invention can reduce a write time taken in writing data in the n numbers of PCR elements to 1/n compared to the related art.

Figure 5:
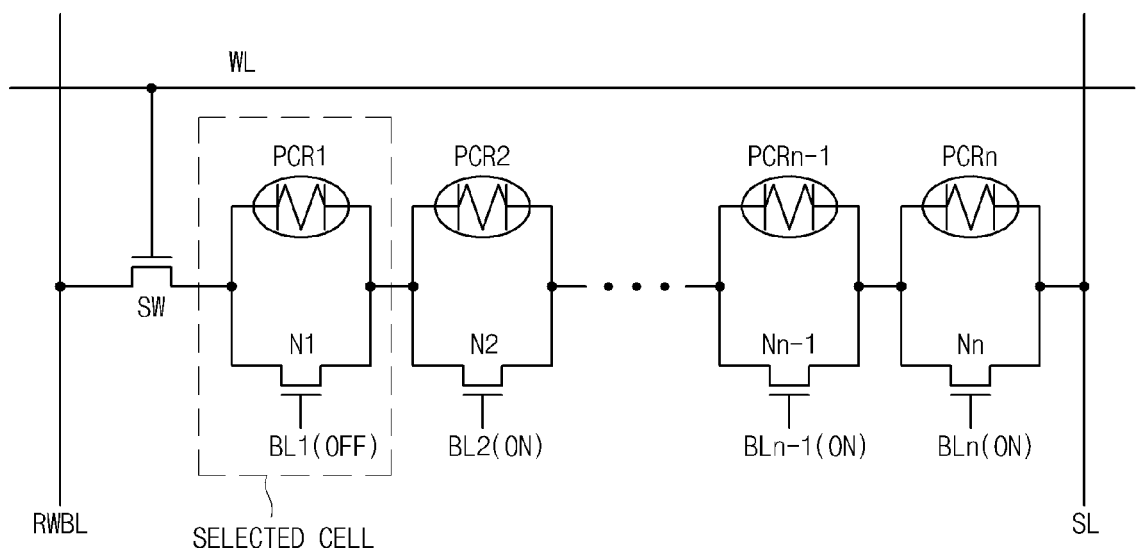
FIG. 5 is a circuit diagram illustrating a read mode of a semiconductor memory device according to an embodiment of the present invention.
Figure 6:
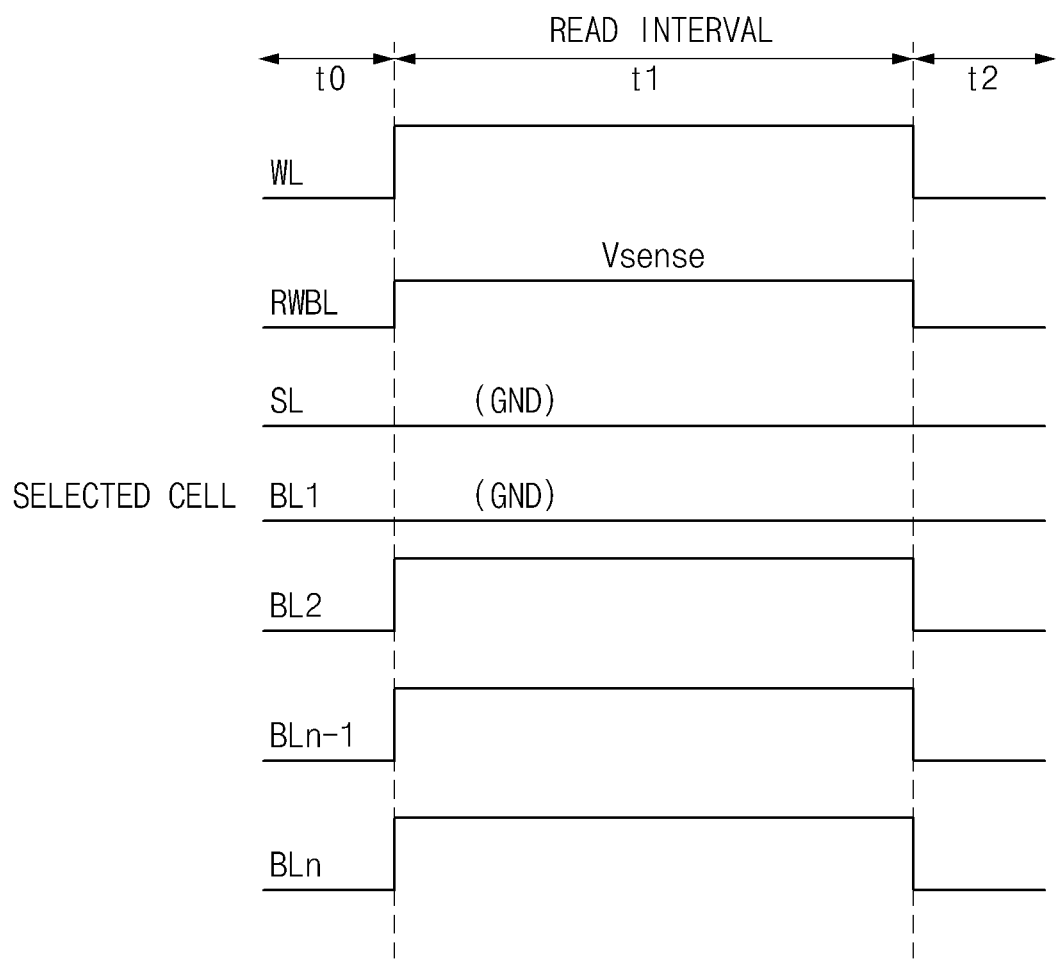
FIG. 6 is an operational timing diagram illustrating the read mode of the semiconductor memory device according to an embodiment of the present invention.

FIG. 5 is a circuit diagram illustrating a read mode of a semiconductor memory device according to an embodiment of the present invention. FIG. 6 is an operational timing diagram illustrating the read mode of the semiconductor memory device according to an embodiment of the present invention. Hereinafter, the read mode of the semiconductor memory device will be described with reference to FIGS. 5 and 6.

In accordance with an embodiment of the present invention, it is assumed that a first unit cell including a PCR element PCR1 and a switching element N1 is selected in read mode. In this case, a low voltage, e.g., a ground voltage GND, is applied to bit line BL1 coupled to the selected unit cell, such that the switching element N1 is turned off. On the other hand, a high voltage is applied to bit lines BL2~BLn coupled to the remaining non-selected cells, such that switching elements N2~Nn of the non-selected unit cells are turned on.

During interval t0, a word line WL, a read/write bit line RWBL, a source line SL, and the bit lines BL1~BLn maintain a low voltage level, e.g., ground voltage level GND. Therefore, the selection switch SW is switched off, such that a connection between the unit cells and the read/write bit line RWBL is blocked.

Thereafter, if the semiconductor memory device enters read mode, and thus a read interval of t1 starts, the word line WL is transitioned to a high voltage level, so that the selection switch SW is switched on. Accordingly, the PCR element PCR1 of the selected unit cell is electrically connected to the read/write bit line RWBL.

During the read interval of t1, the source line SL maintains a ground voltage level, and the bit line BL1 coupled to the selected unit cell is also supplied with the ground voltage level, such that the switching element N1 of the selected unit cell is turned off.

Meanwhile, during read interval t1, the remaining bit lines BL2~BLn coupled to the non-selected cells are transitioned to a high voltage level. Therefore, the switching elements N2~Nn coupled to the remaining bit lines BL2~BLn are turned on, thereby electrically coupling the PCR element PCR1 to the source line SL.

In addition, during the read interval t1, a sensing voltage Vsense for sensing data from among a plurality of cell drive voltages is applied to the read/write bit line RWBL. Therefore, a current corresponding to the selected unit cell, i.e., the PCR element PCR1, flows between the read/write bit line RWBL and the source line SL through the PCR element PCR1. The current also flows through each of the other unit cells, but because the switching elements of those cells are activated and the PCR for each cell has a higher resistance than the lower line, most of the current in the other unit cells flows across the lower lines so that the effect of the resistance value of PCR1 can be sensed.

Figure 7:
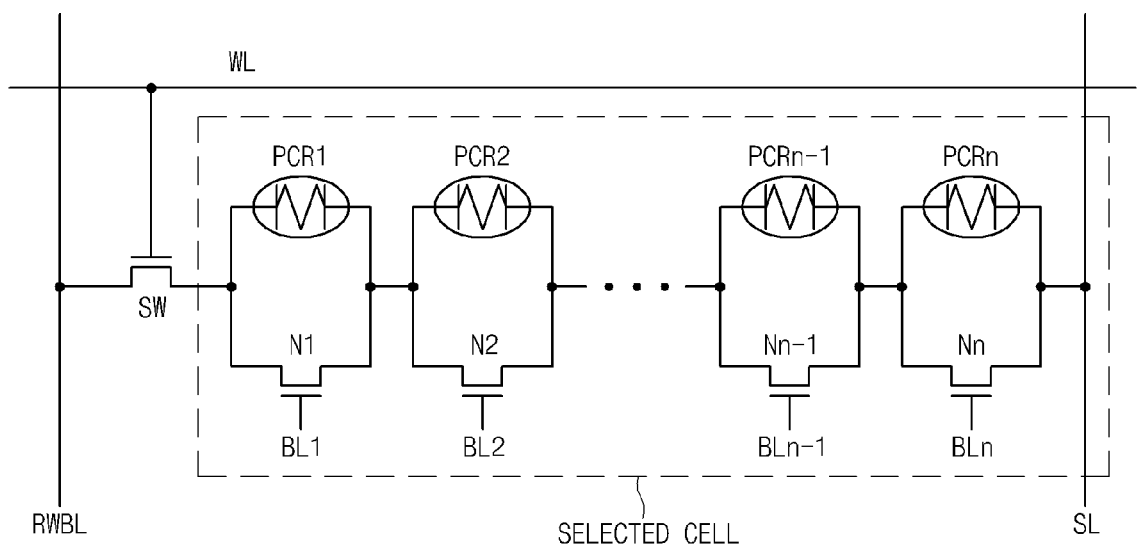
FIG. 7 is a circuit diagram illustrating a write mode of a semiconductor memory device according to an embodiment of the present invention.
Figure 8:
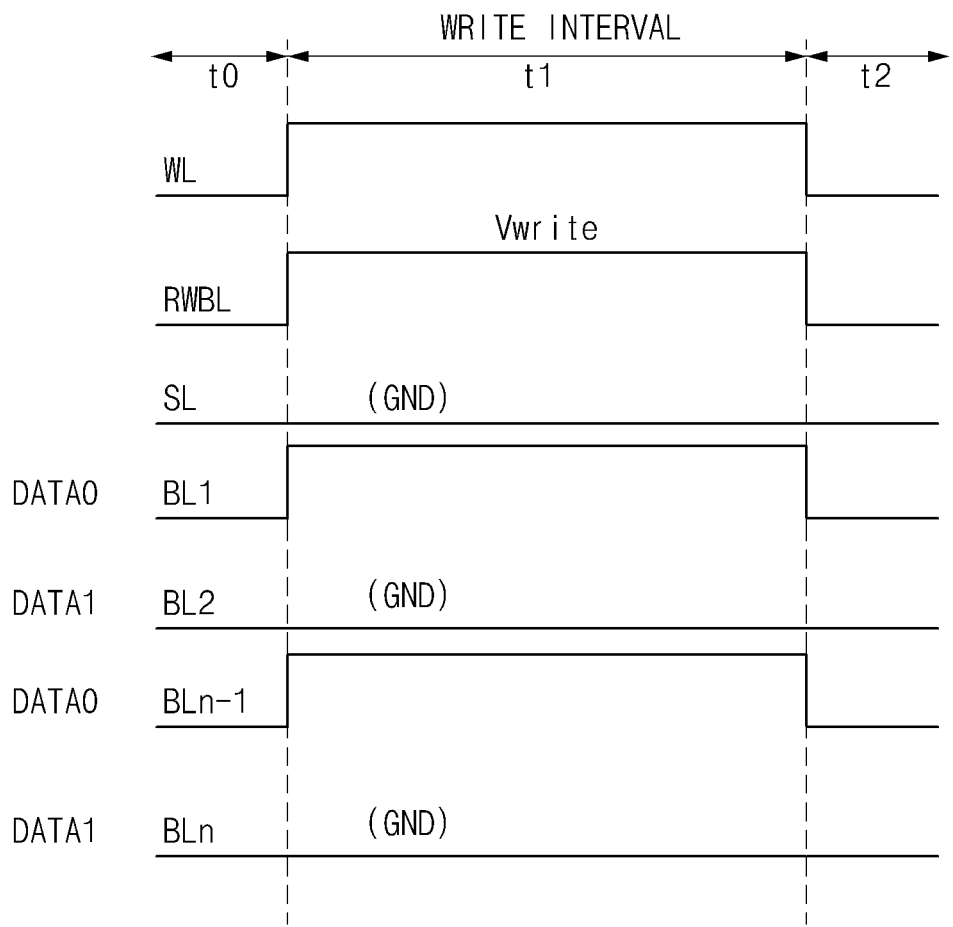
FIG. 8 is an operational timing diagram illustrating the write mode of the semiconductor memory device according to an embodiment of the present invention.

FIG. 7 is a circuit diagram illustrating a write mode of a semiconductor memory device according to an embodiment of the present invention. FIG. 8 is an operational timing diagram illustrating the write mode of a semiconductor memory device according to an embodiment of the present invention.

In accordance with an embodiment of the present invention, it is assumed that all unit cells coupled to and disposed between a selection switch SW and a source line SL are selected in the write mode. In this case, voltages applied to bit lines BL1~BLn coupled to all unit cells are selectively adjusted such that corresponding data can be simultaneously written in a plurality of PCR elements PCR1~PCRn.

As seen in FIG. 8, during interval t0, a word line WL, a read/write bit line RWBL, the source line SL, and the bit lines BL1~BLn maintain a low voltage level, e.g., ground voltage level GND. Therefore, the selection switch SW is switched off, such that connection between the unit cells and the read/write bit line RWBL is blocked.

Thereafter, if the semiconductor memory device enters the write mode, and thus write interval t1 starts, the word line WL is transitioned to a high voltage level. Accordingly, the selection switch SW is turned on, such that the first PCR element PCR1 is electrically connected to the read/write bit line RWBL.

During the write interval of t1, the source line SL maintains a ground voltage level, and a write voltage Vwrite used for writing data from among a plurality of cell drive voltages is applied to the read/write bit line RWBL. Accordingly, corresponding write data can be simultaneously written in all the PCR elements PCR1~PCRn.

For example, if data "0" is written in the PCR element PCR1 to establish a set status, the bit line BL1 coupled to the PCR element PCR1 is transitioned to a high voltage level. As a result, a switching element N1 is turned on, such that the write voltage Vwrite received through the selection switch SW is applied to both of the PCR element PCR1 and the switching element N1.

Accordingly, a write current is divided, and flows in parallel through both the PCR element PCR1 and the switching element N1. In this case, a current flowing in the PCR element PCR1 is reduced relative to the full write current, such that data "0" is written in the PCR element PCR1. That is, if it is assumed that the write current flowing in the selection switch SW is a reset current, a set current lower than the reset current flows in the PCR element PCR1 when switching element N1 is closed.

In the meantime, if a reset status, i.e., data "1", is written in PCR element PCR2, the bit line BL2 coupled to the PCR element PCR2 maintains a low voltage level, e.g., the ground voltage level GND. As a result, the switching element N2 is turned off, such that the write voltage Vwrite received through the selection switch SW is applied only to the PCR element PCR2, and not the switching element N2.

In this case, a current flowing in the PCR element PCR2 corresponds to the write current, such that data "1" is written in the PCR element PCR2. That is, if it is assumed that the write current flowing through the selection switch SW is the reset current, the reset current flows in the PCR element PCR2.

In addition, if the set status, i.e., data "0", is written in the PCR element PCRn-1, the bit line BLn-1 coupled to the corresponding unit cell is transitioned to a high voltage level. As a result, the switching element Nn-1 is turned on, such that the write voltage Vwrite received through the selection switch SW is applied to both the switching element Nn-1 and the PCR element PCRn-1. In this respect, the operation of BLn-1 is similar to the operation of BL1 described above.

At this time, a write current is divided, and flows in parallel through both the PCR element PCRn-1 and the switching element Nn-1. A current flowing in the PCR element PCRn-1 is reduced relative to the full write current, such that data "0" is written in the PCR element PCRn-1. That is, if it is assumed that the write current flowing in the selection switch SW is the reset current, a set current lower than the reset current flows in the PCR element PCRn-1 when switching element Nn-1 is closed.

Meanwhile, if the reset status, i.e., data "1", is written in the PCR element PCRn, the bit line BLn coupled to the corresponding unit cell maintains a low voltage level, e.g., ground voltage level GND. As a result, the switching element Nn is turned off, such that the write voltage Vwrite received through the selection switch SW is applied only to the PCR element PCRn.

In this case, a current flowing in the PCR element PCRn may correspond to the write current, such that data "1" is written in the PCR element PCRn. In more detail, if it is assumed that the write current flowing in the selection switch SW is the reset current, the reset current flows in the PCR element PCRn.

As described above, when a constant write current flows in selection switch SW, a low set current flows in the PCR elements PCR1 and PCRn-1 in which the set status is written, and a high reset current flows in the PCR elements PCR2 and PCRn in which the reset status is written, according to operations of the switching elements N1~Nn controlled by the bit lines BL1~BLn.

As shown above, in accordance with an embodiment of the present invention, data can be simultaneously written in the plurality of PCR elements PCR1~PCRn without increasing the write current supplied to the serially-coupled unit cells. Therefore, the present invention can reduce the magnitude of the write current used for writing data in the n numbers of PCR elements to 1/n compared to the related art. In addition, the present invention can also reduce a write time taken for writing data in the n numbers of PCR elements to 1/n compared to the related art.

Figure 9:
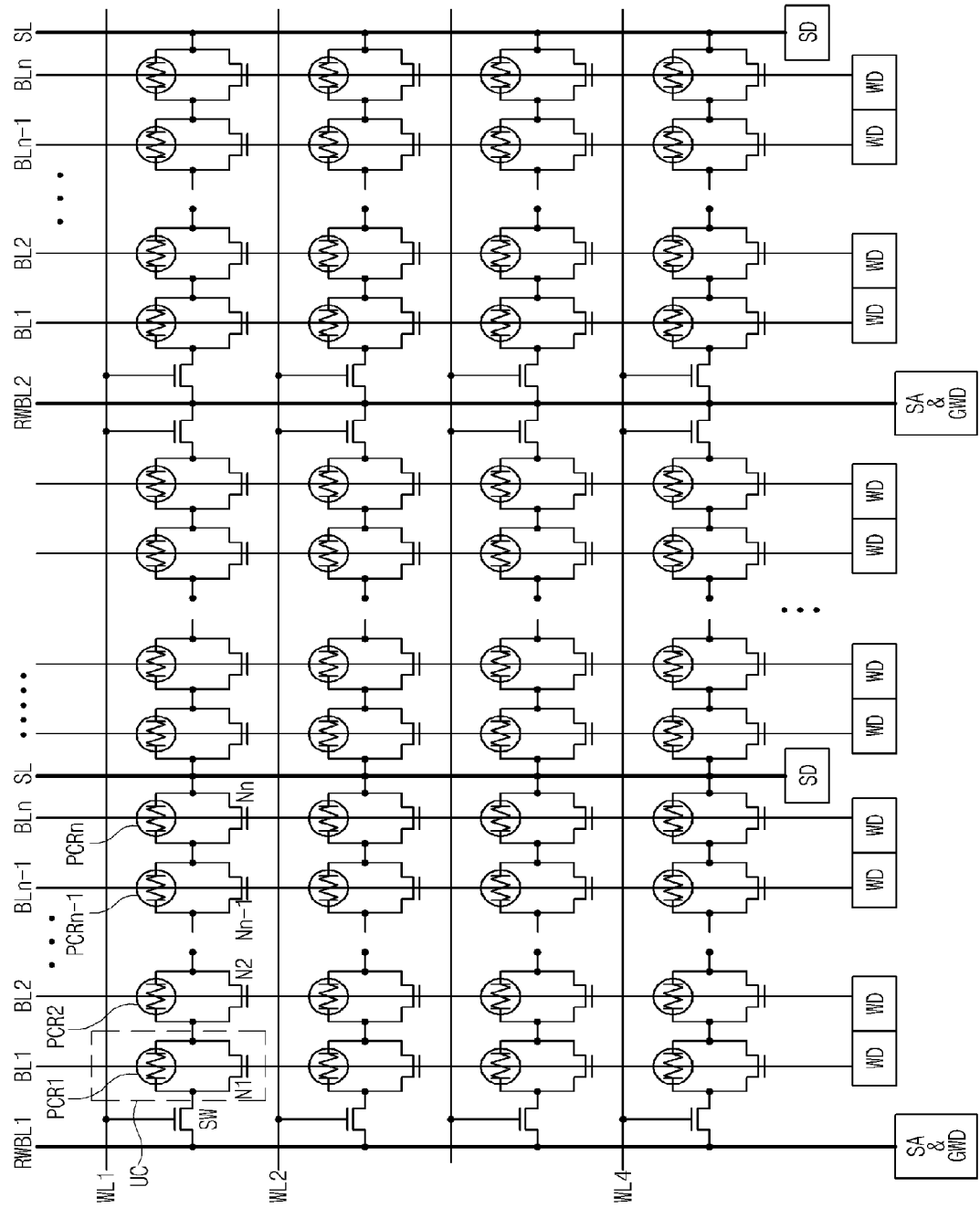
FIG. 9 shows a cell array of a semiconductor memory device according to an embodiment of the present invention.

FIG. 9 shows a cell array of a semiconductor memory device according to an embodiment of the present invention.

Referring to the embodiment shown in FIG. 9, multiple read/write bit lines, e.g., RWBL1 and RWBL2, are arranged in a column direction. Multiple bit lines BL1~BLn are also arranged in the column direction. Multiple word lines, e.g., WL1~WL4, are arranged in a row direction.

A selection switch SW is arranged at each of the intersections between the read/write bit lines RWBL1 and RWBL2 and the word lines WL1~WL4. A plurality of selection switches SW are arranged in row and column directions between read/write bit lines RWBL and adjacent unit cells.

A unit cell UC is arranged at an intersection between each of a plurality of bit lines BL1~BLn and each of the word lines WL1~WL4. A plurality of unit cells UC are arranged in both row and column directions. In the embodiment shown in FIG. 9, one read/write bit line RWBL is coupled to a plurality of selection switches SW. In addition, each source line SL is coupled to a plurality of unit cells UC arranged in the column direction.

Each read/write bit line RWBL is coupled to a sense-amplifier SA and a global write driver GWD. The sense-amplifier SA is configured to sense/amplify a sensing voltage Vsense applied through the read/write bit line RWBL during a read mode. The global write driver GWD provides a write voltage Vwrite or a ground voltage GND to the read/write bit line RWBL during a write mode.

Each bit line BL is coupled to a write driver WD. Therefore, a voltage applied to the bit line BL is selectively controlled in response to a voltage output from the write driver WD during the read or write mode, such that unit cells UC coupled to the bit line BL can be selected.

Each source line SL is coupled to a source driver SD. Therefore, a voltage applied to the source line SL can be selectively adjusted according to the voltage (the ground voltage GND or the write voltage Vwrite) output from the source driver SD during read or write modes.

Figure 10:
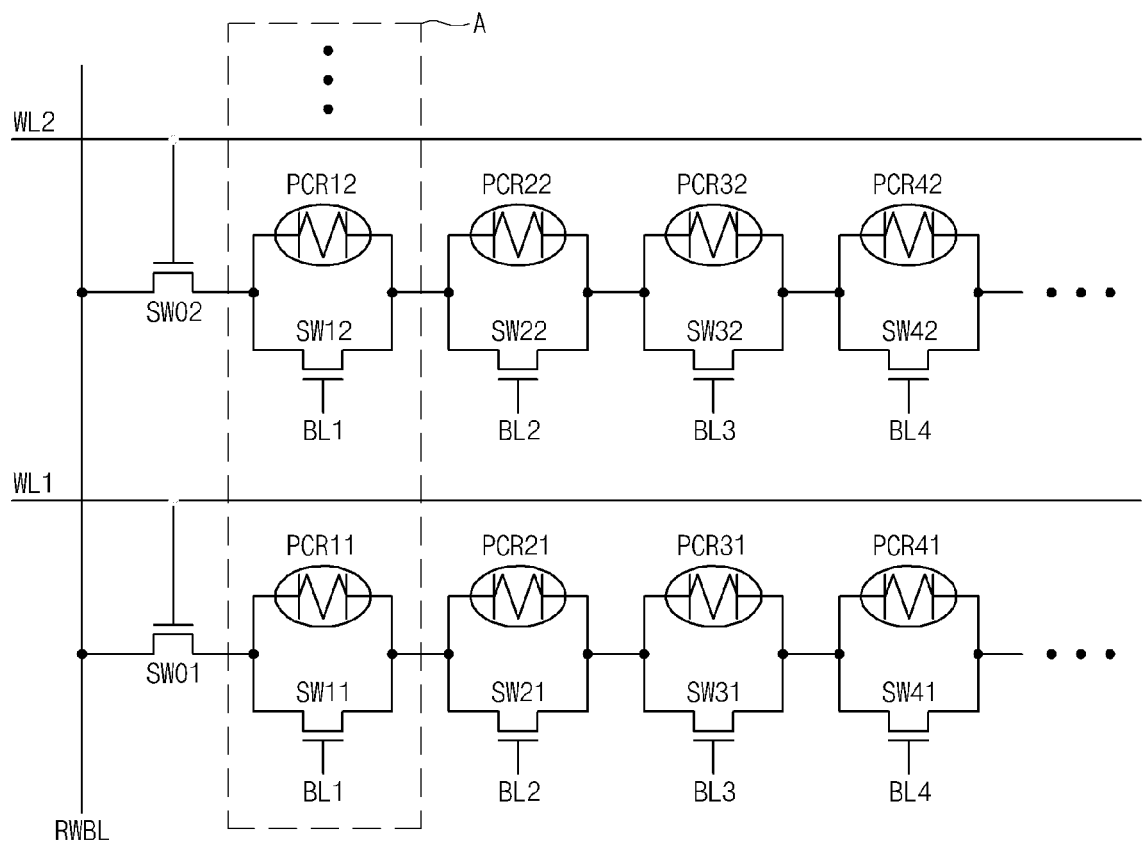
FIG. 10 illustrates a circuit diagram of a laminated cell array in a semiconductor memory device according to an embodiment of the present invention.

FIG. 10 illustrates a circuit diagram of a laminated cell array in a semiconductor memory device according to an embodiment of the present invention.

Referring to FIG. 10, a cell string shown in FIG. 4 is vertically laminated. In other words, the embodiment shown in FIG. 10 shows two of a plurality of layers of unit cells that are vertically stacked upon one another, resulting in a laminated structure. For convenience of description and better understanding of the present invention, hereinafter, the selection switch SW will be referred to as a selection switch SW0$j$, and a plurality of switch elements N1~Nn will be referred to as switching elements "SWij", i and j being positive integers.

In the switching element SWij, "i" indicates the order in which the switching element is coupled to the selection switch SW0$j$, and "j" indicates a specific laminate layer where the switching element SWij is located. For instance, switching element SW11 represents a switching element that is the first switching element coupled to its corresponding selection switch SW01 and located in a first layer of the laminated cell array. A switching element SW12 represents a switching element that is the first switching element coupled to its corresponding selection switch SW02 and located in a second layer of the laminated cell array.

As seen in FIG. 10, each unit cell comprises one PCR and one switching element coupled in parallel. For example, in region (A), the upper unit cell comprises PCR element PCR12 and switching element, SW12, while the lower unit cell comprises PCR element PCR11 and switching element 11.

Figure 11:
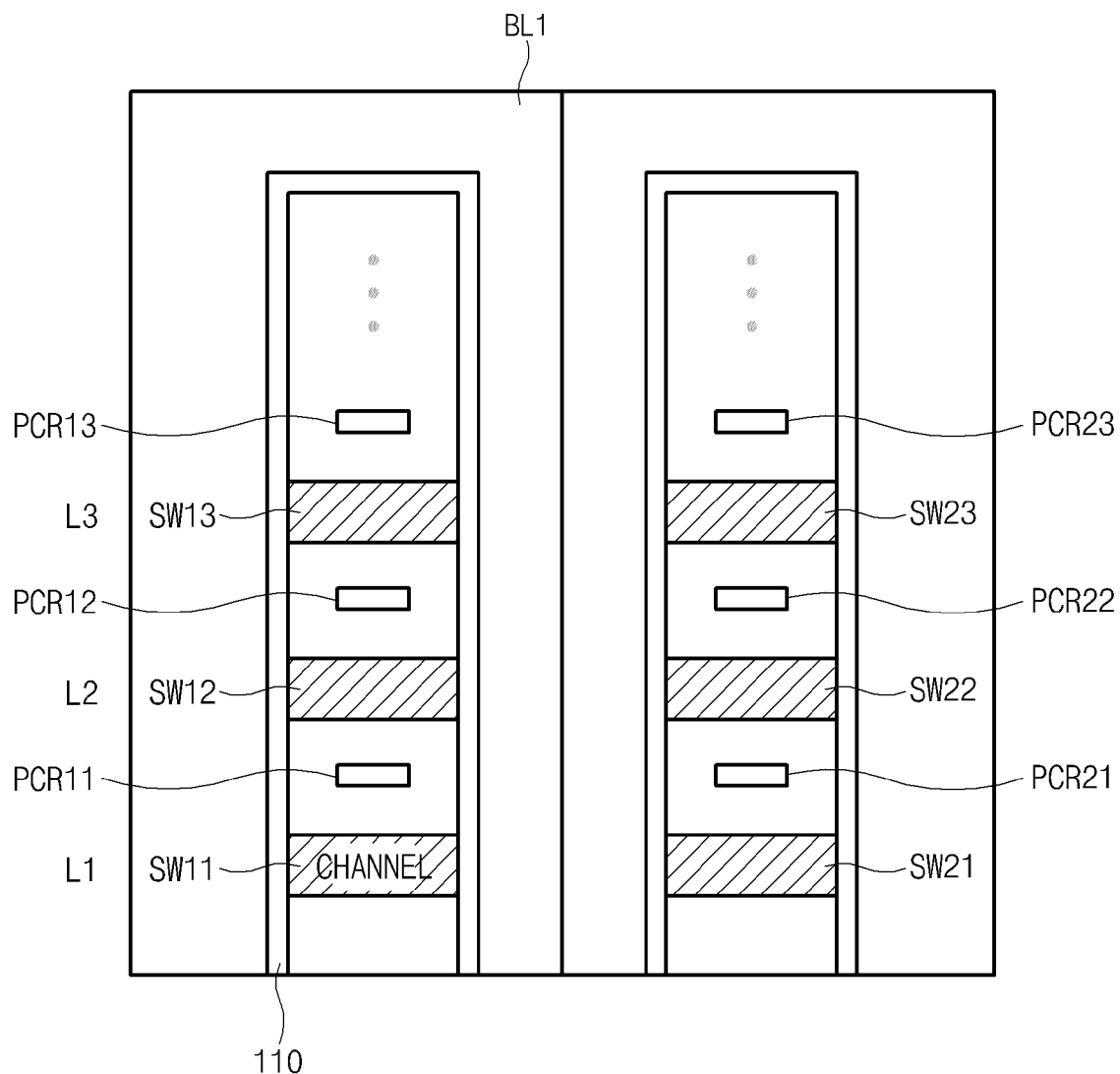
FIG. 11 is a cross-sectional view illustrating a region (A) of the semiconductor memory device shown in FIG. 10, which is arranged in a direction of a bit line, according to an embodiment of the present invention.

FIG. 11 is a cross-sectional view illustrating region (A) of the semiconductor memory device shown in FIG. 10, which is arranged in a direction of a bit line, according to an embodiment of the present invention.

Referring to FIG. 11, in a vertically laminated cell array according to an embodiment of the present invention, a plurality of switching elements, e.g., SW11, SW12, and SW13, are sequentially formed from the bottom to the top, resulting in a laminated structure.

The plurality of switching elements SW11, SW12, and SW13 may be comprised of MOS transistors. Thus, channel regions of the switching elements SW11, SW12, and SW13 are composed of a laminated structure of a layer L1, a layer L2, and a layer L3.

In addition, a gate region 110 is formed over both lateral surfaces and an upper part of the channel regions of the switching elements SW11, SW12, and SW13. In accordance with an embodiment of the present invention, the gate region 110 corresponding to a plurality of unit cells is configured in the form of a vertical structure, in order to simplify the gate formation process.

The gate region 110 for a plurality of laminated channel regions is connected to one bit line BL1. The gate region 110 may be formed of a gate oxide film.

Accordingly, both lateral surfaces and the upper surface of a vertical stack of unit cells configured in the form of a laminated structure, as well as the gate region 110, are covered by the bit line BL1.

In addition, in the vertical stack, a plurality of PCR elements PCR11~PCR13 may be formed over respective channel regions of the switching elements SW1, SW12, and SW13. In this case, a laminated structure of the PCR cells PCR11~PCR13 is connected to drain terminals and source terminals of the switching elements SW11, SW12, and SW13, so that several unit cells are formed in the form of the vertically laminated cell array.

Figure 12:
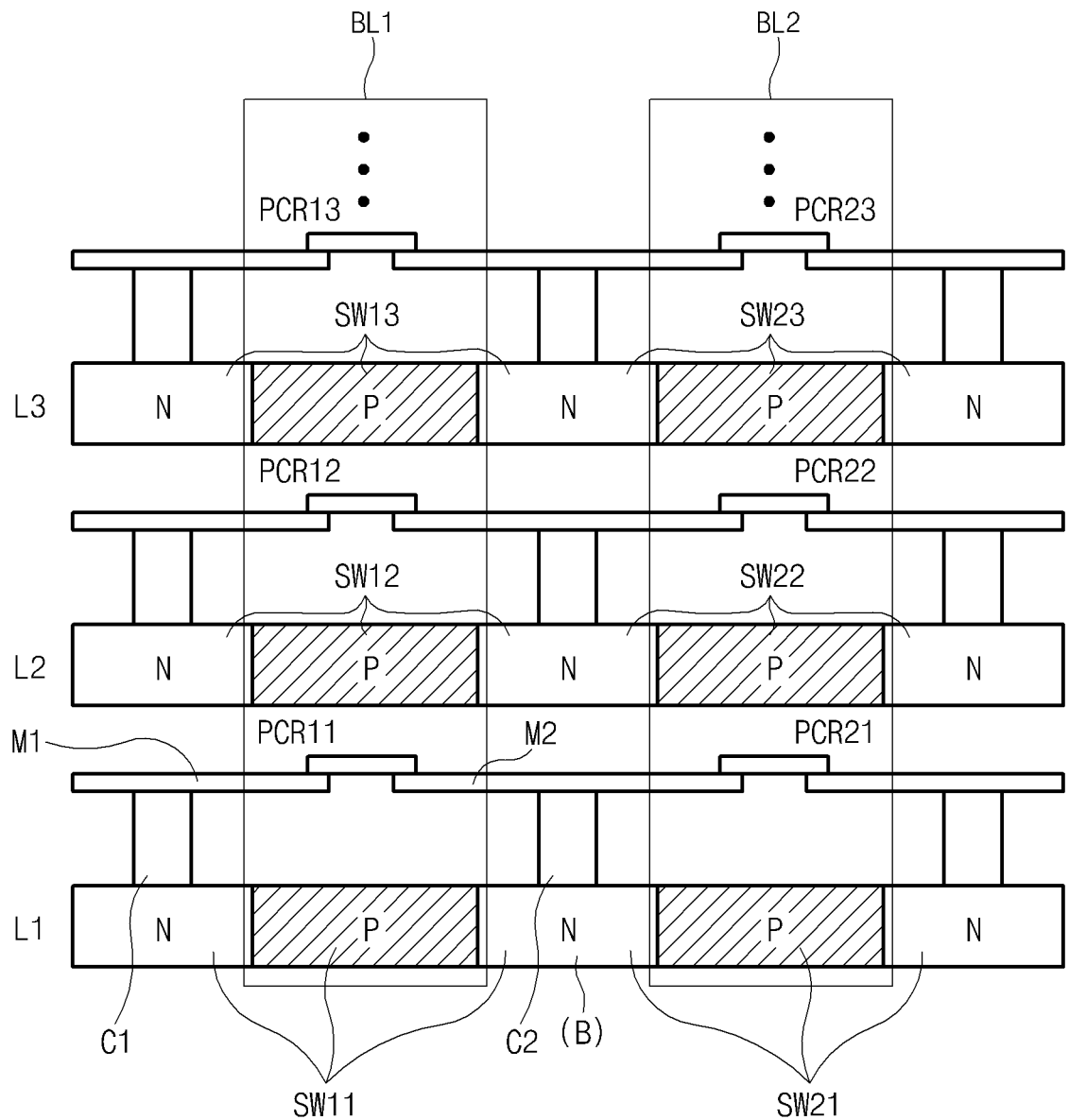
FIGS. 12 and 13 are cross-sectional views illustrating the region (A) of the semiconductor memory device shown in FIG. 10, which is arranged in a direction of a channel region, according to embodiments of the present invention.

FIG. 12 is a cross-sectional view illustrating the region (A) of the semiconductor memory device shown in FIG. 10, which is arranged in a direction of a channel region according to an embodiment of the present invention.

Referring to FIG. 12, the switching elements SW11, SW12, and SW13 include NPN-type enhancement transistors.

In the vertically laminated cell array according to an embodiment of the present invention, the switching elements SW11, SW12, and SW13 are laminated from the bottom to the top.

Each of the switching elements SW11, SW12, and SW13 may be composed of an NPN-type MOS transistor, and channel regions of the switching elements SW11, SW12, and SW13 are formed with a laminated structure of a layer L1, a layer L2, and a layer L3.

The embodiment of the present invention exemplarily shows the NPN-type switching elements SW11, SW12, and SW13. However, the scope or spirit of the present invention is not limited thereto, and thus the switching elements SW11, SW12, and SW13 may be composed of PNP-type MOS transistors in accordance with another embodiment of the present invention.

In the individual layers L1, L2, and L3, the individual switching elements SW11, SW12, and SW13 may share source and drain regions with their neighboring switching elements SW21, SW22, and SW23 as shown in a region (B).

For example, the region (B) may be used as a source region of the switching element SW11, and may be also used as a drain region of the switching element SW21. N-type and P-type regions of each switching element SW11, SW12, SW13, SW21, SW22, or SW23N are connected in series, and repeatedly formed.

The plurality of laminated PCR elements PCR11~PCR13 is commonly coupled to one bit line BL1. In this case, one bit line BL1 is configured in the form of a vertical structure over the layers L1~L3. The bit line BL1 formed in a vertical direction is connected to the P-type channel region of each of the switching elements SW11, SW12, and SW13. However, the bit line BL1 is not formed over the N-type drain and source regions of each of the switching elements SW11, SW12, and SW13.

The plurality of PCR elements PCR11~PCR13 may be formed over the plurality of switching elements SW11, SW12, and SW13, respectively. In this case, each of the laminated PCR elements PCR11~PCR13 is connected to a drain terminal and a source terminal of a corresponding one of the switching elements SW11, SW12, and SW13 through contact plugs C1 and C2, respectively.

Each of the PCR elements PCR11~PCR13 is configured to interconnect two metal lines over a corresponding channel region, and the two metal lines and the PCR elements PCR11~PCR13 are sequentially laminated.

In addition, a left-side drain region of the switching element SW11 is coupled to a first metal line M1 connected to the PCR element PCR11 through the contact plug C1. A right-side source region of the switching element SW11 is coupled to a second metal line M2 connected to the PCR element PCR 11 through the contact plug C2.

That is, neighboring PCR elements, e.g., PCR11 and PCR21, are connected in series in the same layer. Neighboring switching elements SW11 and SW21 share the (B) region and the PCR elements are coupled to the switching elements SW11 and SW21 through the contact plug C2.

In an embodiment, the vertically laminated cell array of an exemplary semiconductor memory device is formed of a laminated structure with a plurality of layers L1~L3. The PCR elements PCR11~PCR13 formed over different layers L1~L3 are electrically isolated from one another by insulation layers interposed between each of the layers.

Figure 13:
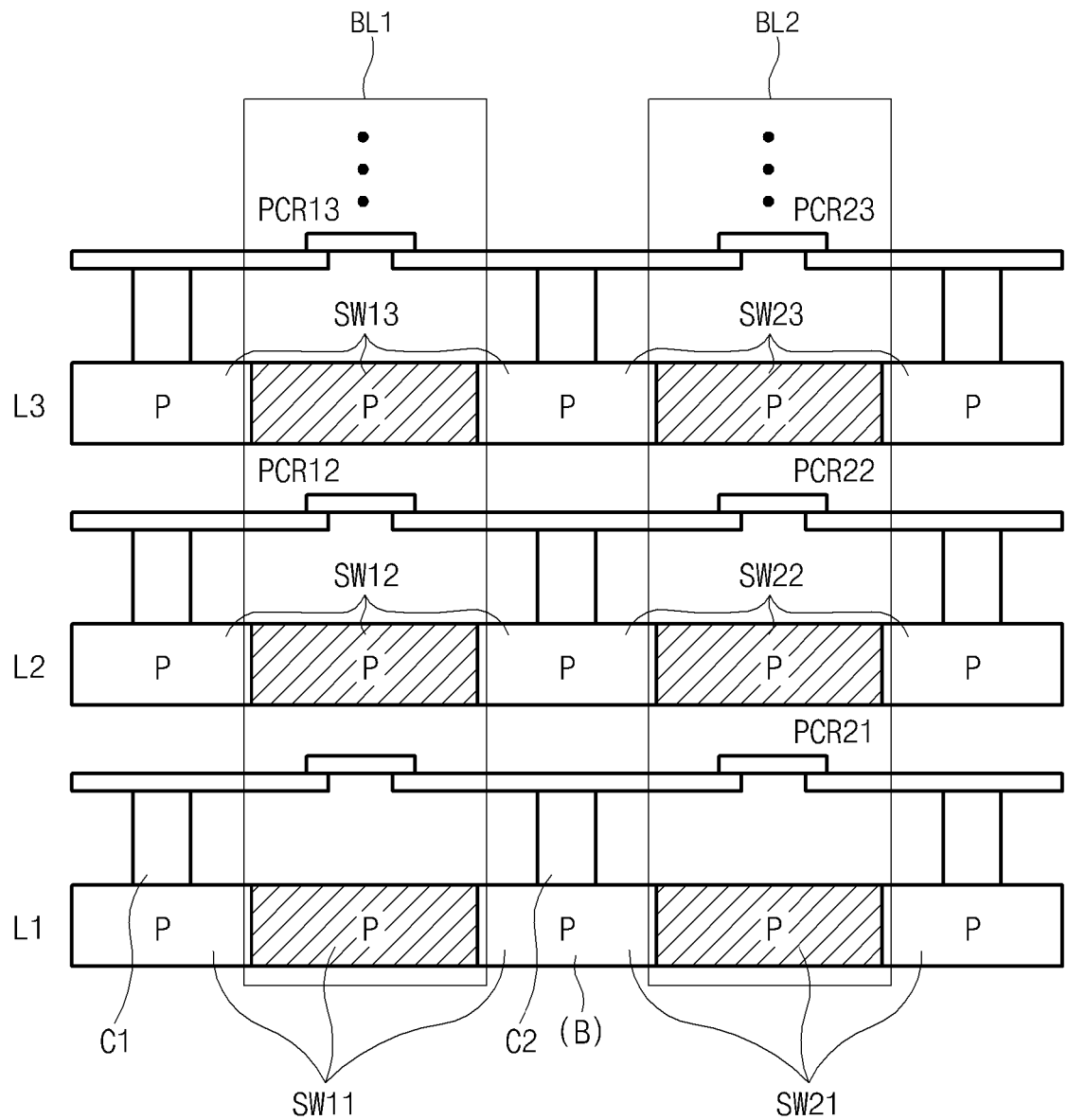

FIG. 13 is a cross-sectional view illustrating region (A) of the semiconductor memory device shown in FIG. 10, which is arranged in the direction of a channel region according to another embodiment of the present invention.

Referring to FIG. 13, the switching elements SW11, SW12, and SW13 include PPP-type depletion transistors.

The switching elements of each of the individual layers L1~L3 are configured such that P-type regions are connected in series.

The exemplary embodiment of the present invention shown in FIG. 13 shows that the switching elements SW11, SW12, and SW13 are formed of the PPP-type depletion transistors. However, the scope of the present invention is not limited thereto, and the switching elements SW11, SW12, and SW13 may be formed of NNN type transistors in accordance with another embodiment of the present invention.

Figure 14:
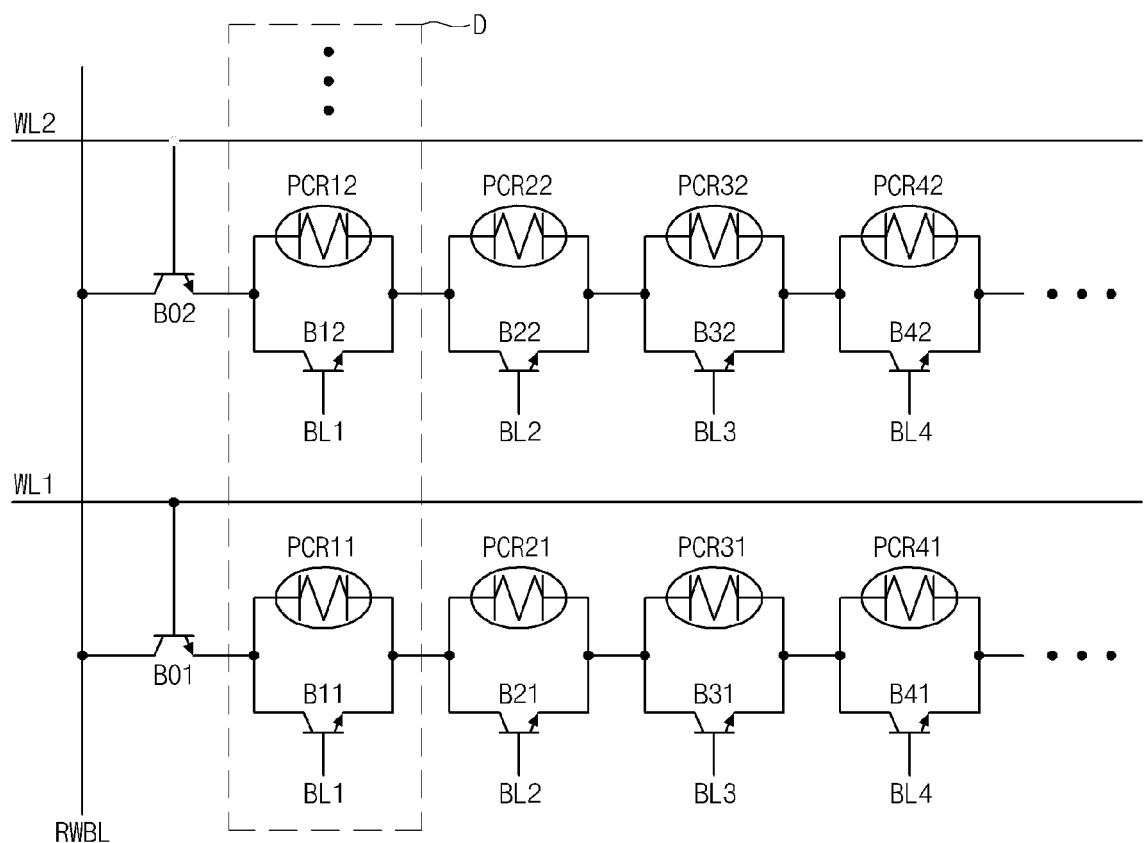
FIG. 14 illustrates a circuit diagram of a laminated cell array in a semiconductor memory device according to another embodiment of the present invention.

FIG. 14 illustrates a circuit diagram of a vertically laminated cell array in a semiconductor memory device according to another embodiment of the present invention.

In the embodiment shown in FIG. 14, each of the switching elements in the vertically laminated cell array is formed of a bipolar junction transistor (BJT).

For convenience of description and better understanding of the present invention, hereinafter, the selection switch SW shown in FIG. 4 will be referred to as a selection switch B0j, and the switching elements N1~Nn shown in FIG. 4 will be referred to as switching elements "Bij", i and j being positive integers.

In the switching element Bij, "i" indicates the order in which the switching element is coupled to the selection switch B0j, and "j" indicates a specific layer where the switching element Bij is located. For instance, a switching element B11 represents a switching element firstly coupled to its corresponding selection switch B01 and located in a first layer of the laminated cell array. A switching element B12 represents a switching element firstly coupled to its corresponding selection switch B02 and located in a second layer of the laminated cell array.

In one lower unit cell, one PCR element PCR11 and one switching element B11 are coupled in parallel to each other. In each of the remaining upper unit cells, one PCR element, e.g., PCR12, and one switching element, e.g., B12, are coupled in parallel to each other.

The selection switch B01 is connected between a read/write bit line RWBL and the PCR element PCR11, and a base region of the selection switch B01 is coupled to a word line WL1.

One electrode of the PCR element PCR11 is coupled to an emitter region of the switching element B11, and the other electrode thereof is coupled to a collector region of the switching element B11. Base regions of the switching elements B11, B21, B31, and B41 are coupled to a plurality of bit lines BL1~BL4, respectively.

Although exemplary embodiments of the present invention have disclosed the selection switch and a plurality of switching element formed of NPN-type bipolar junction transistors, the scope of the present invention is not limited thereto. In an embodiment, the selection switch and the switching elements may be implemented with PNP-type bipolar junction transistors.

Figure 15:
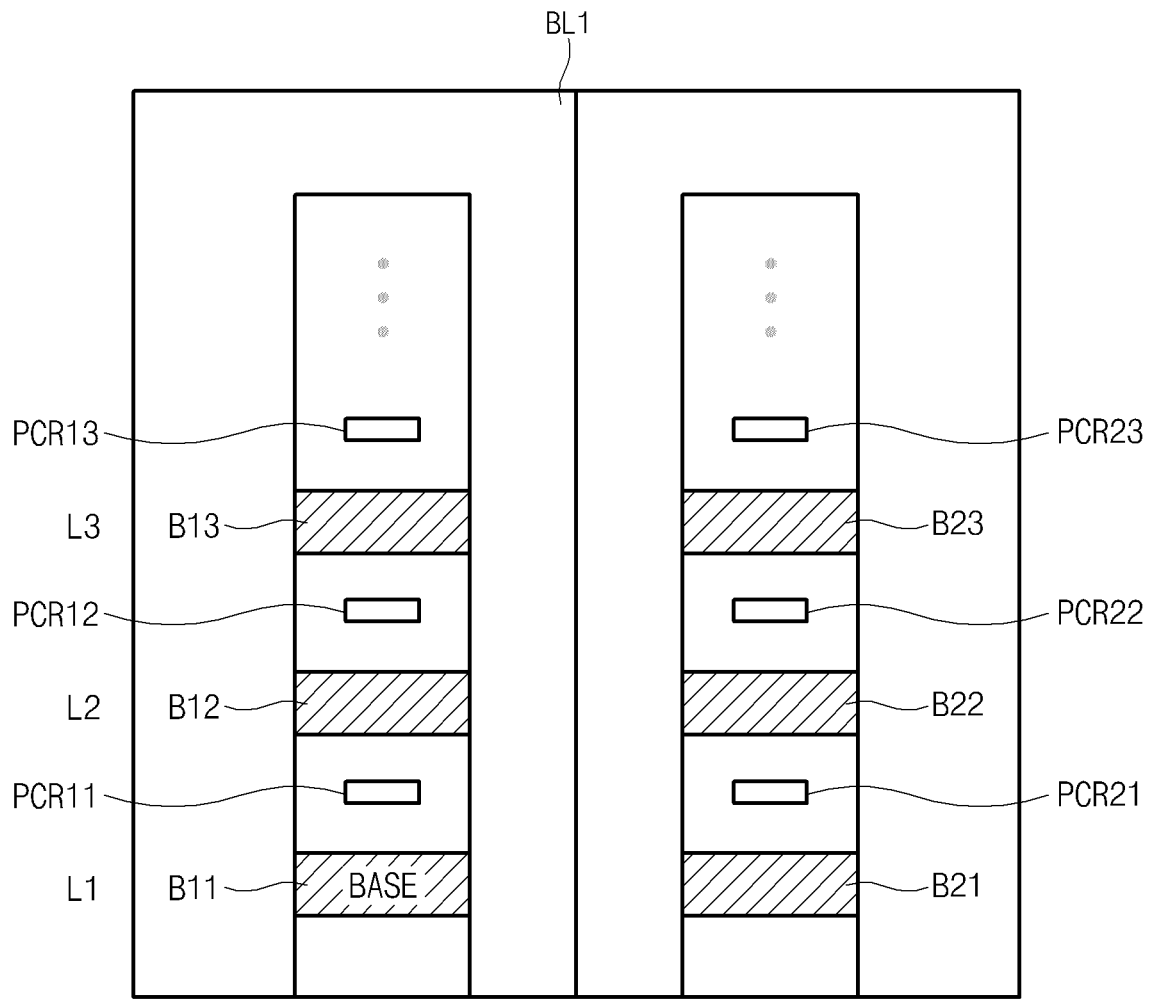
FIG. 15 is a cross-sectional view illustrating a region (D) of the semiconductor memory device shown in FIG. 14, which is arranged in a direction of a bit line, according to an embodiment of the present invention.

FIG. 15 is a cross-sectional view illustrating region (D) of the semiconductor memory device shown in FIG. 14, which is arranged in a direction of a bit line, according to an embodiment of the present invention.

Referring to FIG. 15, the plurality of switching elements, e.g., B11, B12, and B13, is sequentially laminated from the bottom to the top in the vertically laminated cell array.

The plurality of switching elements B11, B12, and B13 may be formed of bipolar junction transistors, and base regions thereof are formed in a laminate structure comprising layers L1, L2, and L3.

A bit line BL1 is formed over both lateral surfaces and an upper part of the base regions of the switching elements B11, B12, and B13. The laminated base regions may be commonly connected to the bit line BL1.

In the embodiment shown in FIG. 15, the bit line BL1 is formed to cover both lateral surfaces and a top surface of the vertically laminated cell array in which the base regions of the switching elements B11, B12, and B13 and PCR elements PCR11~PCR13 are formed.

The PCR elements PCR11~PCR13 may be formed over the base regions of the switching elements B11, B12, and B13, respectively. Each of the PCR elements PCR11~PCR13 is connected to an emitter region and a collector region of corresponding switching elements B11, B12, and B13), respectively, so that unit cells are formed.

As is apparent from the above description, a semiconductor memory device according to embodiments of the present invention includes a plurality of vertically stacked cell strings, each of which includes a plurality of serially-coupled phase change resistor (PCR) elements. The device uses one bit line having a vertical structure for a plurality of vertically laminated unit cells to increase a degree of cell integration, and minimize cell manufacturing costs.

Semiconductor memory devices according to embodiments of the present invention can simplify a gate formation process by forming a plurality of vertically laminated gate regions corresponding to a plurality of unit cells, respectively.

In addition, in accordance with embodiments of the present invention, a semiconductor memory device capable of simultaneously storing a plurality of data can be simply implemented by using a cell string including serially-coupled resistors, i.e., a plurality of PCR cells coupled in series.

Those skilled in the art will appreciate that the present invention may be carried out in specific ways other than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device, comprising:
    a first plurality of unit cells sequentially stacked in a plurality of layers; and
    a bit line having a vertical structure and coupled to each of the first plurality of unit cells,
    wherein each of the first plurality of unit cells includes:
        a switching element including a source region, a drain region, and a channel region; and
        a phase change resistor (PCR) element formed over the switching element.

2. The semiconductor memory device according to claim 1, wherein the bit line is coupled to the channel region of the switching element.

3. The semiconductor memory device according to claim 1, further comprising:
    a plurality of contact plugs configured to couple PCR elements of the first plurality of unit cells to source and drain regions of switching elements of the first plurality of unit cells.

4. The semiconductor memory device according to claim 1, wherein each of the first plurality of unit cells further comprises:
    a first contact plug coupled to and disposed between the drain region and a first end of the PCR element; and
    a second contact plug coupled to and disposed between the source region and a second end of the PCR element.

5. The semiconductor memory device according to claim 1, further comprising a gate region having a vertical structure and coupled to first and second sides of a plurality of channel regions of the first plurality of unit cells.

6. The semiconductor memory device according to claim 5, wherein the gate region covers both lateral surfaces and a top surface of the first plurality of unit cells.

7. The semiconductor memory device according to claim 1, wherein the bit line covers both lateral surfaces and a top surface of the first plurality of unit cells.

8. The semiconductor memory device according to claim 1, wherein the switching element includes a metal oxide semiconductor (MOS) transistor in which the drain region, the source region, and the channel region have the same polarity.

9. The semiconductor memory device according to claim 1, wherein the switching element includes a metal oxide semiconductor (MOS) transistor in which the drain region and the source region have a first polarity, and the channel region has a second polarity different from the first polarity.

10. The semiconductor memory device according to claim 1, further comprising:
    a second plurality of unit cells sequentially stacked in the plurality of layers,
    wherein the second plurality of unit cells is adjacent to the first plurality of unit cells, and
    wherein each switching element of the first plurality of unit cells is coupled to a corresponding switching element of each of the second plurality of unit cells, the switching elements coupled to each other being formed in the same layer.

11. The semiconductor memory device according to claim 10, wherein the switching elements coupled to each other share a source region or a drain region.

12. The semiconductor memory device according to claim 10, wherein unit cells including the switching elements coupled to each other, respectively, construct a cell string that is coupled to and disposed between a single selection switch and a source line, the selection switch being employed to select the cell string.

13. A semiconductor memory device, comprising:
    a first plurality of unit cells sequentially stacked in a plurality of layers; and
    a single bit line having a vertical structure and shared by the first plurality of unit cells,
    wherein each of the first plurality of unit cells includes:
        a switching element including an emitter region, a collector region, and a base region, and
        a phase change resistor (PCR) element formed over the switching element.

14. The semiconductor memory device according to claim 13, wherein the bit line is coupled to the base region of the switching element.

15. The semiconductor memory device according to claim 13, further comprising:
a plurality of contact plugs configured to couple PCR elements of the first plurality of unit cells to emitter and collector regions of switching elements of the first plurality of unit cells.

16. The semiconductor memory device according to claim 13, wherein each of the first plurality of unit cells further comprises:
a first contact plug coupled to and disposed between the collector region and a first end of the PCR element; and
a second contact plug coupled to and disposed between the emitter region and a second end of the PCR element.

17. The semiconductor memory device according to claim 13, wherein the bit line covers both lateral surfaces and a top surface of the first plurality of unit cells.

18. The semiconductor memory device according to claim 13, further comprising:
a second plurality of unit cells sequentially stacked in the plurality of layers,
wherein the second plurality of unit cells is adjacent to the first plurality of unit cells, and
wherein each switching element of the first plurality of unit cells is coupled to a corresponding switching element of each of the second plurality of unit cells, the switching elements coupled to each other being formed in the same layer.

19. The semiconductor memory device according to claim 18, wherein the switching elements coupled to each other share a collector region or an emitter region.

20. The semiconductor memory device according to claim 18, wherein unit cells including the switching elements coupled to each other, respectively, construct a cell string that is coupled to and disposed between a single selection switch and a source line, the selection switch being employed to select the cell string.

* * * * *